(12) United States Patent
Saito (10) Patent No.: US 8,963,242 B2
(45) Date of Patent: Feb. 24, 2015

(54) POWER SEMICONDUCTOR DEVICE

(71) Applicant: Kabushiki Kaisha Toshiba, Tokyo (JP)

(72) Inventor: Wataru Saito, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/787,603

(22) Filed: Mar. 6, 2013

(65) Prior Publication Data

US 2014/0084361 A1 Mar. 27, 2014

(30) Foreign Application Priority Data

Sep. 21, 2012 (JP) ................................. 2012-208592

(51) Int. Cl.
| | | |
|---|---|---|
| H01L 29/78 | (2006.01) | |
| H01L 29/66 | (2006.01) | |
| H01L 29/06 | (2006.01) | |
| H01L 29/10 | (2006.01) | |

(52) U.S. Cl.
CPC ...... *H01L 29/7802* (2013.01); *H01L 29/66712* (2013.01); *H01L 29/7815* (2013.01); *H01L 29/0634* (2013.01); *H01L 29/1095* (2013.01); *H01L 29/0696* (2013.01)
USPC 257/341; 257/492; 257/E29.27; 257/E29.066; 257/E29.257

(58) Field of Classification Search
CPC ............ H01L 29/7802; H01L 29/7815; H01L 29/0634; H01L 29/1095; H01L 29/0696; H01L 29/66712
USPC .................. 257/341, 492, E29.027, E29.066, 257/E29.257
See application file for complete search history.

(56) References Cited

U.S. PATENT DOCUMENTS

| | | | | |
|---|---|---|---|---|
| 7,385,250 | B2 * | 6/2008 | Omura et al. ................. | 257/341 |
| 7,932,553 | B2 * | 4/2011 | Yamaguchi et al. .......... | 257/328 |
| 8,106,453 | B2 * | 1/2012 | Miyajima ..................... | 257/341 |
| 2006/0289915 | A1 | 12/2006 | Omura et al. | |
| 2007/0177444 | A1 * | 8/2007 | Miyajima ..................... | 365/221 |
| 2012/0211833 | A1 * | 8/2012 | Tamura et al. ................ | 257/339 |

FOREIGN PATENT DOCUMENTS

| | | |
|---|---|---|
| JP | 2006-093459 A | 4/2006 |
| JP | 2006351985 | 12/2006 |
| JP | 2009-147297 A | 7/2009 |

* cited by examiner

*Primary Examiner* — Zandra Smith
*Assistant Examiner* — Toniae Thomas
(74) *Attorney, Agent, or Firm* — Patterson & Sheridan, LLP (57) ABSTRACT

A power semiconductor device includes first to fifth electrodes, first to sixth semiconductor layers, and several first pillar layers. The first semiconductor layer is formed on the first electrode. The second semiconductor layer is formed on the first semiconductor layer. Several first pillar layers are arranged parallel with the second semiconductor layer. The third and fourth semiconductor layers are formed on the second semiconductor layer. The fourth electrode is formed on the first pillar layer adjacent to the third semiconductor layer. The fifth electrode is formed on the first pillar layer adjacent to the fourth semiconductor layer. The concentration of dopant of the first pillar layer positioning between the first pillar layer under the fourth electrode and the first pillar layer under the fifth electrode is lower than the concentration of dopant of the first pillar layer under the fourth electrode and the first pillar layer under the fifth electrode.

15 Claims, 7 Drawing Sheets

POWER SEMICONDUCTOR DEVICE

CROSS-REFERENCE TO RELATED APPLICATION

This application is based upon and claims the benefit of priority from Japanese Patent Application No, 2012-208592, filed Sep. 21, 2012; the entire contents of which are incorporated herein by reference.

FIELD

Embodiments described herein relate to a power semiconductor device.

BACKGROUND

As a power semiconductor device, for example, there is a vertical power MOSFET (Metal Oxide Semiconductor Field Effect Transistor). In the vertical power MOSFET, there is a constitution in which a sense electrode for detecting a current flowing in the device is formed. Therefore, the breakdown of the device due to an over-current can be prevented.

In the vertical power MOSFET having a sense electrode, the current ratio (sense ratio) of a current flowing in the sense electrode and a current flowing in a source electrode is temperature dependant.

DETAILED DESCRIPTION

Embodiments of the present disclosure provide a power semiconductor device with a stable sense ratio.

Here, the drawings are schematic or conceptual, and the relationship between the thickness and the width of each part, the ratio of the size between parts, etc., are not necessarily depicted the same as that of actual devices. In addition, even in the case where the same parts are shown in different Figures, the mutual size or ratio there between may be differently shown in the different Figures herein.

Here, in this specification and each drawing, the same numerals are given to elements which are the same or similar to the elements in previously described drawings hereof, so their detailed explanation is appropriately omitted.

According to an embodiment of the present disclosure, a power semiconductor device including a first electrode, a first semiconductor layer, a second semiconductor layer, several first pillar layers, a third semiconductor layer, a fourth semiconductor layer, a fifth semiconductor layer, a sixth semiconductor layer, a second electrode, a third electrode, a fourth electrode, and a fifth electrode is provided. The first semiconductor layer is formed on the first electrode and electrically connected to the first electrode. The second semiconductor layer is formed on the first semiconductor layer. The several first pillar layers are formed in the second semiconductor, arranged in the first direction perpendicular to the stacking direction of the first semiconductor layer and the second semiconductor layer (of a different conductivity type). The third semiconductor layer is formed on the second conductive layer, and is of a second conductivity type. The fourth semiconductor layer is formed at a position different from the third semiconductor layer on the second semiconductor layer, and is of a second conductivity type. The fifth semiconductor layer is formed on the third semiconductor layer, is adjacent to the first pillar layers via the third semiconductor layer in the first direction, and is of a first conductivity type. The sixth semiconductor layer is formed on the fourth semiconductor layer, is adjacent to the first pillar layers via the fourth semiconductor layer in the first direction, and is of a first conductivity type. The second electrode is electrically connected to the third semiconductor layer and the fifth semiconductor layer. The third electrode is formed on the second semiconductor layer, separated from the second electrode in the first direction, and electrically connected to the fourth semiconductor layer and the sixth semiconductor layer. The fourth electrode is formed via an insulating film on the third semiconductor layer, on the fifth semiconductor layer, and on the first pillar layers adjacent to the third semiconductor layer. The fifth electrode is formed via an insulating film on the fourth semiconductor layer, on the sixth semiconductor layer, and on the first pillar layers adjacent to the fourth semiconductor layer. The concentration of dopant of the first pillar layer positioning between the first pillar layer positioning under the fourth electrode and the first pillar layer positioning under the fifth electrode is lower than the concentration of dopant of the first pillar layer positioning under the fourth electrode and the concentration of dopant of the first pillar layer positioning under the fifth electrode.

First Embodiment

Figure 1A:
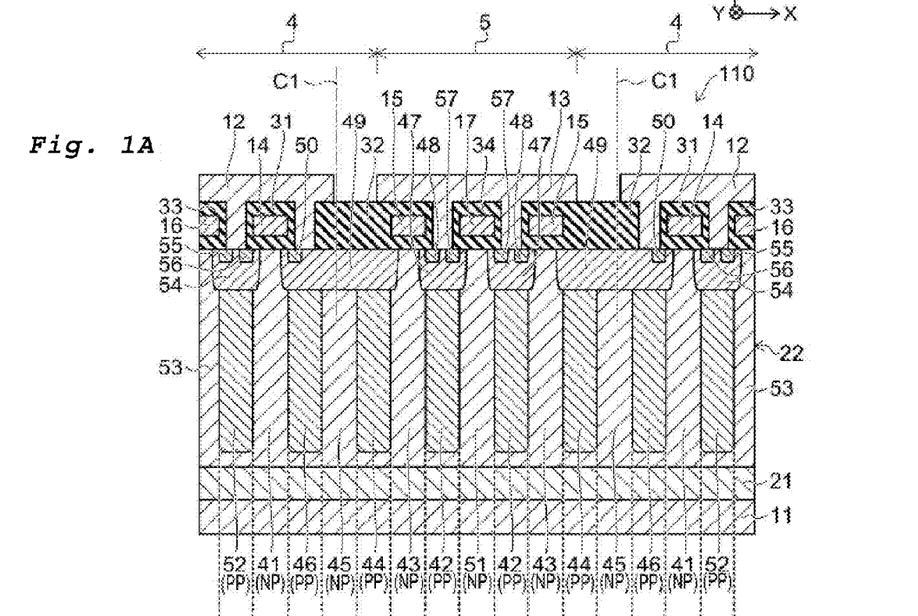
FIG. 1A and FIG. 1B are schematic sectional views showing the constitution of the power semiconductor device of a first embodiment, and of the dopant profile thereof.
Figure 1B:
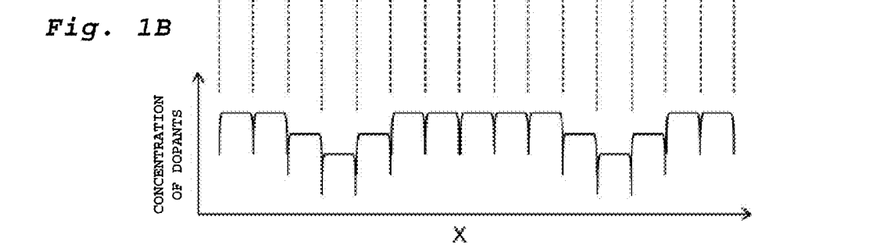
Figure 2:
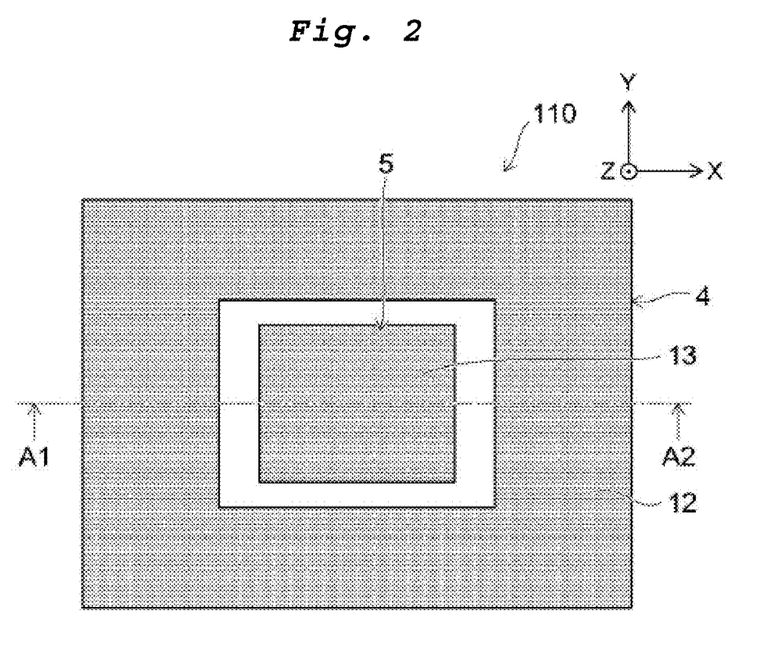
FIG. 2 is a schematic plan view showing a top view of the power semiconductor device of the first embodiment.

FIG. 1A and FIG. 1B are sectional diagram showing the structure of the power semiconductor device of the first embodiment at section line A1-A2 of FIG. 2, and a dopant profile thereof.

FIG. 2 is a schematic plan view showing the top view of the power semiconductor device of the first embodiment.

As shown in FIG. 1A, a MOSFET 110 is provided with a drain electrode 11 (first electrode), a source electrode 12 (second electrode) a sense electrode 13 (third electrode) a gate electrode 14 (fourth electrode), a gate electrode 15 for sense (fifth electrode) an n$^+$ drain layer 21 (first semiconductor layer), a drift layer 22 (second semiconductor layer), a gate insulating film 31, and a gate insulating film 32 for sense. The MOSFET 110 has a planar gate-type structure. In this MOSFET 110, a current flowing between the drain and the source can be detected by the sense electrode 13.

The n$^+$ drain layer 21 is formed on the drain electrode 11 and electrically connected to the drain electrode 11. The n$^+$ drain layer 21 is n-type (first conductivity type). For reference, the first conductivity type may also be a p type. In this case, the second conductivity type is an n type. Here, the electric connection also includes the interposition of other conductive members in addition to a direct contact.

The drift layer 22 is formed on the n+ drain layer 21.

Here, the stacking direction (direction and location of layers from first drain layer 21) of the n+ drain layer 21 and the drift layer 22 is the Z-axis direction of the FIG. One direction perpendicular to the Z-axis direction, and in the plane of the page having the FIG., is assumed as the X-axis direction. The direction perpendicular to the Z-axis direction and the X-axis direction is assumed as the Y-axis direction (inwardly and outwardly of the page). In this example, the first direction is the X-axis direction.

The drift layer 22 includes a plurality of alternating doped pillar layers, here an n-pillar layer 41, a p-pillar layer 42, an n-pillar layer 43, a p-pillar layer 44, a n-pillar layer 45, and a p-pillar layer 46.

The n-pillar layer 41, the n-pillar layer 43, and the n-pillar layer 45 are respectively n type (i.e., n-doped) and extend in the Z-axis direction. The p-pillar layer 42, the p-pillar layer 44, and the p-pillar layer 46 are respectively p type (i.e., p doped) and extend in the Z-axis direction. Therefore, the drift layer 22 includes several n-pillar layers NP (first pillar layers) and second p-pillar layers PP (second pillar layers). Several n-pillar layers NP are parallel to the X-axis direction. Several p-pillar layers PP are formed between each of several n-pillar layers NP.

The p-pillar layers are separated from the n-pillar layers in the X-axis direction. The MOSFET 110 is further provided with a p-base layer 47 for sense (fourth semiconductor layer), an n-source layer 48 for sense (sixth semiconductor layer), a p-base layer 49 (third semiconductor layer), and an n-source layer 50 (fifth semiconductor layer). The p-base layer 47 for sense is a p type and is formed at a position different from the p-base layer 49 on the drift layer 22. In this example, the p-base layer 47 for sense is formed on the p-pillar layer 42. Therefore, the p-base layer 47 for sense is formed on at least one of several p-pillar layers PP. The n-source layer 48 for sense is an n type layer and is formed in the p-base layer 47 for sense. The p-base layer for sense 47, positioned over the p type pillar layer 42, also extends and between the n-pillar layers 43 and 51, and between sense electrode 13 and p-pillar layer 42. The n-source layer 48 for sense, extends inwardly of the p-base layer for sense 47 at the interface thereof with the sense electrode 13, and is spaced from the n-pillar layer 43 via the p-base layer 47 for sense in the X-axis direction.

The p-base layer 49 is p doped and is formed in the substrate overlying the drift layer 22. In this example, the p-base layer 49 is formed on and extends over the p-pillar layers 46, 44, and the n-pillar layer 45 which extends between the p-pillar layers 46, 44. Thus, the p-base layer 49 is formed over at least three of the p-pillar layers PP. An n-base layer 50 is an n doped line and is formed inwardly of the p-base layer 49 at the interface of p base layer 49 and source electrode 32. The p-base layer 49 extends between the n-pillar layer 41 and the n-source layer 50 in the X-axis direction, as the p base layer 49 is also bounded, at its sides, by the upper reaches of the n pillars 41 and 43. In addition, the n-source layer 50 is formed between the center C1 of the width in the X-axis direction of the p-type base layer 49 and the n-pillar layer 41, i.e., it is offset from the center of the p base layer 49 in the direction of n-pillar layer 41. In other words, the center C1 of the p-base layer 49 is provided between the n-source layer 50 and the n-source layer 48 for sense.

The drift layer 22 further includes an n-pillar layer 51 extending between spaced apart p type pillar regions 42 and the n-sense layer 47 thereover, and a p-pillar layer 52 and an n-pillar layer 53 wherein the p-pillar layer 52 extends between p-pillar 52, 46. The MOSFET 110 further includes a p-base layer 54 formed over the p-pillar layer 52, and an n-source layer 55 having an n-source layer 56 embedded therein.

The n-pillar layer 51 is n doped and extends in the Z-axis direction. The n-pillar layer 51 is separated from the n-pillar layers 43 in the X-axis direction by the p-pillar layers 42. The p-pillar layer 52 is a p type and extends in the Z-axis direction. The p-pillar layer 52 is separated from the p-pillar layer 46 in the X-axis direction. The n-pillar layer 41 is formed between the p-pillar layer 46 and the p-pillar layer 52 in the X-axis direction.

The n-pillar layer 53 is an n type and extends in the Z-axis direction. The n-pillar layer 53 is separated from the n-pillar layer 41 in the X-axis direction. The p-pillar layer 52 is formed between the n-pillar layer 41 and the n-pillar layer 53 in the X-axis direction.

In the drift layer 22, several n-pillar layers NP and several p-pillar layers PP are arranged in an alternate fashion in the X-axis direction. In other words, several n-pillar layers NP and several p-pillars PP are provided periodically to the drift layer 22. That is, a super junction structure (hereinafter, referred to an SJ structure) is formed in the drift layer 22 by several n-pillar layers NP and several p-pillar layers PP.

The concentration of dopants in the n-pillar layer 41, n-pillar layer 43, the n-pillar layer 45, and the n-pillar layer 53 are all lower than the concentration of dopant in the n+ drain layer 21. In this example, the p-pillar layer 42, the p-pillar layer 44, the p-pillar layer 46, and the p-pillar layer 52 are not in contact with the n+ drain layer 21, i.e., a portion of the n doped drift layer 22 intervenes between the bases of the p-pillar layers and the n+ drain layer 21. The p-pillar layer 42, the p-pillar layer 44, the p-pillar layer 46, and the p-pillar layer 52 may also be configured to contact with the n+ drain layer 21 (not shown).

The p-base layer 54 is p doped and is formed on the p-pillar layer 52. The n-source layer 55 and the n-source layer 56 are, respectively, n type and are formed on the p-base layer 54. The p-base layer 54 extends between the n-pillar layer 53 and the adjacent n-source layer 55 in the X-axis direction and also extends between the n-pillar layer 41 and the adjacent n-source layer 56 in the X-axis direction. The n-source layer 55 and the n-source layer 56, for example, extend into the p-base layer 54.

The n-source layer 57 for sense is n doped and is formed into the p-base layer 47 for sense. The p-base layer 47 for sense extends between the adjacent n-pillar layer 51 and the n-source layer 57 for sense in the X-axis direction.

Exemplified as the n+ drain layer 21 and the drift layer 22 are, for example, semiconductors such silicon, compound semiconductors such as silicon carbide (SiC) or gallium nitride (GaN), or wide band gap semiconductors such as diamond.

The source electrode 12 is formed on the drift layer 22. The source electrode 12 is positioned over the n-pillar layer 41, the p-pillar layer 46, the p-pillar layer 52, and the n-pillar layer 53. The source electrode 12 is electrically connected to the p-base layer 49 and the n-source layer 50 therein, the p-base layer 54 and the n-source layers 55, 56 therein.

The sense electrode 13 is formed over the drift layer 22 and is isolated from the source electrode 12 in the X-axis direction. The sense electrode 13 is arranged over the p-pillar layer 42, n-pillar layer 43, and the n-pillar layer 51. The sense electrode 13 is electrically connected to the p-base layer 47 for sense, and the n-source layers 48, 57 for sense.

As the source electrode 12 and the sense electrode 13, for example, aluminum is used. As the drain electrode 11, for example, metallic materials such as V, Ni, An, Ag, or Sn are used.

A gate electrode 14 is formed between the source electrode 12 and the drift layer 22, to overly the n-pillar layer 41, and contact the p-base layer 49, and the p-base layer 54. The source electrode also contacts and partially overlies the n-source layer 50 in the p-base layer and the p-base layers, 55, 56, extending into the base layer 54.

A gate insulating film 31 surrounds the gate electrode and extends between the n-pillar layer 41 and the gate electrode 14, between the p-base layer 49 and the gate electrode 14, between a portion the n-source layer 50 and p-base layer 49 and the gate electrode 14, between the p-base layer 54 and the gate electrode 14, between a portion of the n-source layer 56 and p-based layer 54 and the gate electrode 14, and between the source electrode 12 and the gate electrode 14. The gate insulating film 31 electrically insulates the source electrode 12 and the gate electrode 14, and electrically insulates the drift layer 22 and the gate electrode 14.

The gate electrode 15 for sense is formed between the sense electrode 13 and the drift layer 22, and overlies the n-pillar layer 43, and partially overlies the p-base layer 47 for sense and the n-source layer 48 for sense, and also partially overlies the adjacent to another p-base layer for sense) p-base layer for sense 47 and the n-source layer extending therein. The gate electrode 15 for sense is electrically connected to the gate electrode 14. The gate insulating film 32 for sense surrounds the gate electrode 15 for sense and is formed between the n-pillar layers 43 and the gate electrode 15 for sense, between the p-base layer 47 for sense and the gate electrode 15 for sense, between the n-source layer 48 for sense and the gate electrode 15 for sense, and between the sense electrode 13 and the gate electrode 15 for sense. The gate insulating film 32 for sense electrically insulates the sense electrode 13 and the gate electrode 15 for sense, and electrically insulates the drift layer 22 and the gate electrode 15 for sense.

The MOSFET 110 is further provided with a gate electrode 16, gate electrode 17 for sense, gate insulating film 33, and gate insulating film 34 for sense.

The gate electrodes 16 are formed between the source electrode 12 and the drift layer 22. The gate electrodes 16 are located over the n-pillar layer 53, and portions of the p-base layer 54, and the n-source layer 55. The gate electrode 16 is electrically connected to the gate electrode 14.

The gate electrode 17 for sense is located between the sense electrode 13 and the drift layer 22, and overlies the n-pillar layer 51, and partially overlies the p-base layer 47s for sense and the n-source layer 57 for sense extending therein, at either side of n-base layer 51. The gate electrode 17 for sense is electrically connected to the gate electrode 14, the gate electrode 16, and gate electrode 15 for sense.

The gate insulating film 34 for sense surrounds the gate electrode 17 for sense. For example, polysilicon, etc., are used as the gate electrode 14, gate electrode 15 for sense, the gate electrode 16, and gate electrode 17 for sense. As the gate insulating film 31, gate insulating film 32 for sense, gate insulating film 33, and gate insulating film 34 for sense, for example, at least any of silicon oxide (for example, $SiO_2$), silicon nitride, and silicon oxynitride is used.

The abscissa of FIG. 1B is the position x in the X-axis direction of FIG. 1A, and the ordinate is the concentration of dopant in the pillar layers.

FIG. 1B shows the concentration of dopant in each of several n-pillar layers (41, 43, 45, 51, 53) and several p-pillar layers (42, 44, 46, 52) of the drift layer 22 as the ordinate. In the MOSFET 110, the concentration of dopant in the several n-pillar layers NP is substantially uniform in the Z-axis direction, and the concentration of dopant in the several p-pillar layers PP is similarly, substantially uniform in the Z-axis direction.

As shown in FIG. 1B, the concentration of dopant in the n-pillar layer 45 is lower than the concentration of dopant in the n-pillar layer 41, lower than the concentration of dopant in the n-pillar layer 43, lower than the concentration of dopant in the n-pillar layer 51, and lower than the concentration of dopant in the n-pillar layer 53. In other words, the concentration of dopant of the n-pillar layer 45 located between p-pillars 44, 46 and underlying the p-based layer 49 between the n-pillar layer is lower than the concentration of dopant of the n-pillar layer 41 and the concentration of dopant of the n-pillar layer 43. In this example, the concentration of dopant in the n-pillar layer 41, the concentration of dopant in the n-pillar layer 43, the concentration of dopant in the n-pillar layer 51, and the concentration of dopant in the n-pillar layer 53 are mutually, substantially the same.

The concentration of dopant in the p-pillar layers 44 and 46 is lower than the concentration of dopant in the p-pillar layer 42, and in the p-pillar layer 52. In other words, the concentration of dopant of the p-pillar layer 44 and the p-pillar layer 46 positioned between the n-pillar layers 41 and 49 is lower than the concentration of dopant of the p-pillar layer 42 and the p-pillar layer 52. In this example, the concentration dopant in the p-pillar layer 44 is substantially the same as the concentration of dopant in the p-pillar layer 46. In addition, the concentration of dopant in the p-pillar layer 42 is substantially the same as the concentration of dopant in the p-pillar layer 52.

Additionally, the n-pillar layers 45 disposed below the p-based layers 49 has a lower dopant concentration than the other n-pillar layers 41, 43, 51 which all have approximately the same dopant concentration. Additionally, the dopant concentration of the n-pillar layers 45 is lower than the dopant concentration of the p-pillar layers 44, 46 to either side of the n-pillar layers 45. As shown in FIG. 2, the source electrode 12 surrounds the sense electrode 13 in the X and Y -axis directions and thus the p-base layer 49 surrounds the p-base layer 47 for.

Next, the operation in the MOSFET 110 will be explained.

In operation of the MOSFET 110 a positive voltage is applied to the drain electrode 11, the source electrode 12 is grounded, and a positive voltage is applied to the gate electrode 14 and the gate electrode 16. Therefore, a current flows between the drain electrode 11 and the source electrode 12. If a voltage is applied to the drain electrode 11, source electrode 12, gate electrode 14, and the gate electrode 16, an inverted channel is formed in an area adjacent to the gate insulating film 31 of the p-base layer 49 and an area adjacent to the gate insulating film 31 and the gate insulating film 33 of the p-base layer 54. A current, for example, flows to the source electrode 12 from the drain electrode 11 via the $n^+$ drain layer 21, the n-pillar layer 41, the n-pillar layer 53, inverted channel, the n-source layer 50, the n-source layer 55, and the n-source layer 56.

A sense resistor (not shown) is connected between the source electrode 12 and the sense electrode 13. If a voltage is applied to the gate electrode 14 and the gate electrode 16, and substantially same voltage is applied to the gate electrode 15 for sense and the gate electrode 17 for sense, an inverted channel is formed in an area adjacent to the gate insulating film 32 for sense and the gate insulating film 34 for sense of the p-base layer 47 for sense. Therefore, a current flows to the sense electrode 13 from the drain electrode 11 via the $n^+$ drain layer 21, n-pillar layer 43, the n-pillar layer 51, inverted channel, the n-source layer 48 for sense, and the n-source layer 57 for sense. By measuring of the voltage drop in the sense resistor, a load current flowing between the drain and the source can be detected.

In the following, the portion of the power semiconductor that sends a current to the source electrode 12 is called a main cell portion 4, and the portion of the power semiconductor that sends a current to the sense electrode 13 is called a sense portion 5. The main cell portion 4, for example, includes the gate electrode 14, the gate electrode 16, the gate insulating film 31, gate insulating film 33, the n-pillar layer 41, the p-base layer 49, the n-source layer 50, the n-pillar layer 53, the p-base layer 54, the n-source layer 55, and the n-source layer 56. The sense portion 5, for example, includes the gate electrode 15 for sense, gate electrode 17 for sense, gate insulating film 32 for sense, gate insulating film 34 for sense, n-pillar layer 43, the p-base layer 47 for sense, the n-source layer 43 for sense, the n-pillar layer 51, and the n-source layer 57 for sense.

Next, the effects that are exerted by the MOSFET 110 will be explained.

In an MOSFET including the sense electrode 13, the sense ratio, for example, is determined by a resistance ratio that is determined by the resistance between the drain electrode 11 and the source electrode 12 and the resistance between the drain electrode 11 and the sense electrode 13. The resistance ratio, for example, is determined by an area ratio of the area of the source electrode 12 and the area of the sense electrode 13. In addition, if the propagation mode of a current in a current path of the main cell portion 4 and a current path of the sense portion 5 is different, the temperature coefficient of the resistance is different, causing temperature dependency in the sense ratio. Therefore, the detection sensitivity of the current is reduced.

On the contrary, in the MOSFET 110 of this embodiment, the concentration of dopant in the n-pillar layer 45 is lower than the concentration of dopant in the n-pillar layer 41, lower than the concentration of dopant in the n-pillar layer 43, lower than the concentration of dopant in the n-pillar layer 51, and lower than the concentration of dopant in the n-pillar layer 53. In other words, a low dopant concentration area, resulting in a higher resistance, is formed between the main cell portion 4 and the sense portion 5. Therefore, in the MOSFET 110, even if the main cell portion 4 and the sense portion 5 are adjacent, the propagation of a current in the device can be suppressed. A portion of the current flowing in the main cell portion 4 is suppressed from flowing to the sense portion 5. Therefore, in the MOSFET 110, the temperature dependency of the sense ratio can be suppressed. In the MOSFET 110, a power semiconductor device with a stable sense ratio can be provided.

If the degree of propagation of the current is large, the sense ratio is changed by the position where the sense portion 5 is formed. In the MOSFET 110, since the propagation of the current is small, the sense ratio is not substantially changed, regardless of the position where the sense portion 5 is formed. Therefore, the degree of freedom of the design can also be raised in the MOSFET 110.

In the MOSFET 110, the breakdown voltage is partially raised in the n-pillar layer 45 with low dopant concentration. Therefore, the occurrence of an avalanche breakdown at the periphery of the sense portion 5 can be suppressed. The decrease of the amount of avalanche resistance due to the installation of the sense portion 5 can be suppressed.

In the MOSFET 110, the n-source layer 50 is formed between the center C1 of the width in the X-axis direction of the p-base layer 49 and the n-pillar layer 41. In other words, in the MOSFET 110, no n-source layer is formed overlying the sense portion 5 of the p-base layer 49. Therefore, in case an avalanche current is sent into the p-base layer 49 by applying an overvoltage, a parasitic bipolar transistor action can be suppressed. For example, the damage of the MOSFET 110 due to the current concentration on the p-base layer 49 can be suppressed.

Next, a modified example of the first embodiment will be explained.

Figure 3A:
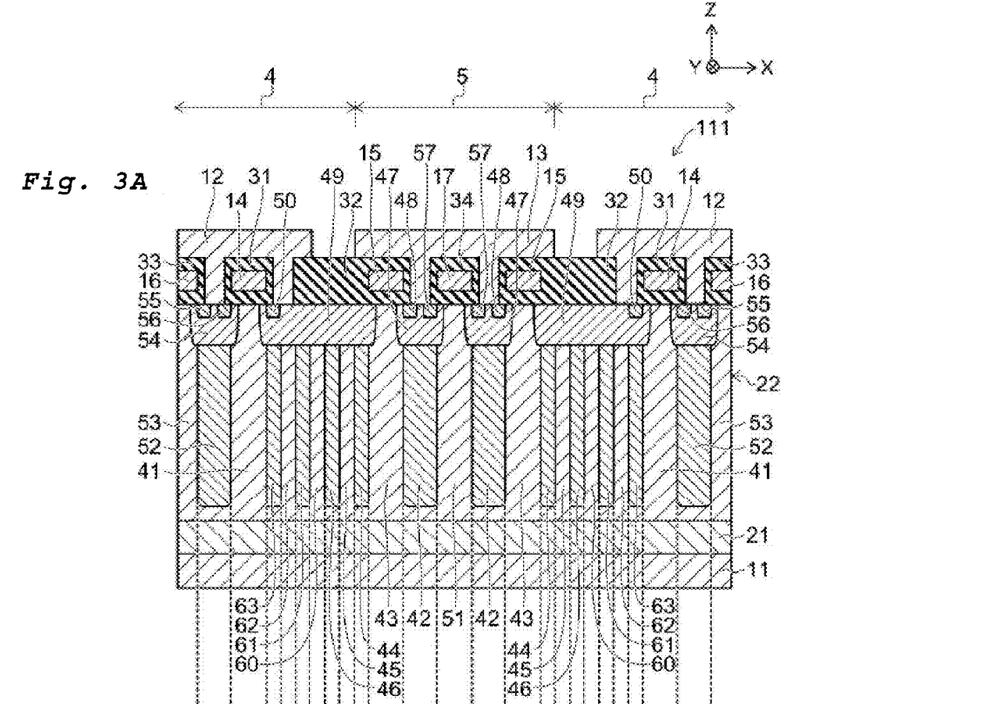
FIG. 3A and FIG. 3B are schematic sectional views, of a power semiconductor device of a modified example of the first embodiment, and of the dopant profile thereof.
Figure 3B:
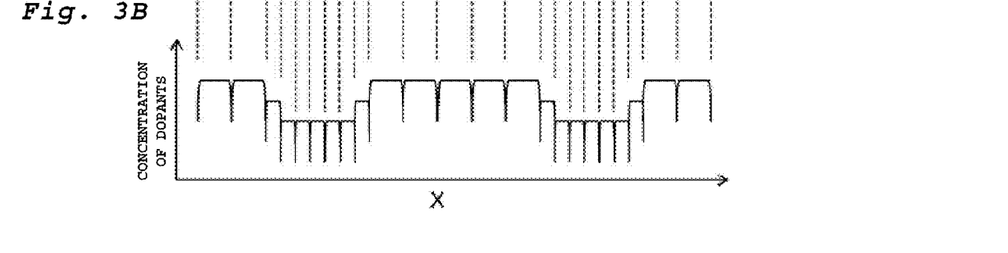

FIG. 3A and FIG. 3E are schematic diagrams showing the constitution of the power semiconductor device of a modified example of the first embodiment.

FIG. 3A is a schematic cross section showing the constitution of the MOSFET 111, FIG. 3B is a graph showing a concentration profile of dopant in the MOSFET 111.

As shown in FIG. 3A, the drift layer 22 of the MOSFET 111 further includes an n-pillar layer 60, p-pillar 61, n-pillar layer 62, and p-pillar layer 63 all underlying the p-base layer 49, in contrast to a single n-pillar layer bounded by opposed p-pillar layers 44, 46 under p-base layer 49 of FIG. 1.

The n-pillar layer 60 and the n-pillar layer 62 are, respectively, n doped and extend in the Z-axis direction. The p-pillar layer 61 and the p-pillar layer 63 are, respectively, p doped and likewise extend in the Z—axis direction. The n-pillar layer 60 is formed between the n-pillar layer 41 and the p-pillar layer 46 in the X-axis direction. The p-pillar layer 61 is formed between the n-pillar layer 41 and the n-pillar layer 60 in the X-axis direction. The n-pillar layer 62 is formed between the n-pillar layer 41 and the p-pillar layer 61 in the X-axis direction. The p-pillar layer 63 is formed between the n-pillar layer 41 and the n-pillar layer 62 in the X-axis direction.

The upper ends of pillar layers 60, 61, 62 and 63 contact the p-base layer 49, and are spaced from the drain layer 21 by the drift layer 22, although they may extend through the drift layer 22 to the drain layer 21. As shown in FIG. 3B, the dopant concentration in the p-pillar layer 44, the dopant concentration in the p-pillar layer 46, the dopant concentration in the p-pillar layer 61, and the dopant concentration in the p-pillar layer 63 are lower than the concentration of dopant in the p-pillar layer 42, and lower than the concentration of dopant of the p-pillar layer 52. The concentration of dopant in the n-pillar layer 45, the concentration of dopant in the n-pillar layer 60, and the concentration of dopant in the n-pillar layer 62 are lower than the concentration of dopant in the n-pillar 41, and lower than the concentration of dopant in the n-pillar layer 43. In addition, the concentration of dopant in the p-pillar layer 46 and the concentration of dopant in the p-pillar layer 61 are lower than the concentration of dopant in the p-pillar layer 44 and the concentration of dopant in the p-pillar layer 63. The dopant concentration in pillar layers 45, 46, 60, 61 and 62 are all approximately equal.

The length along the X-axis direction of each semiconductor layer is assumed as the width of the semiconductor layers. The width of the p-pillar layer 44 is narrower than the width of the p-pillar layer 42. The width of the n-pillar layer 45 is narrower than the width of the n-pillar layer 41. The width of the p-pillar layer 46 is narrower than the width of the p-pillar layer 42. The width of the n-pillar layer 60 is narrower than the width of the n-pillar layer 41. The width of the p-pillar layer 61 is narrower than the width of the p-pillar layer 42. The width of the n-pillar layer 62 is narrower than the width of the n-pillar layer 41. The width of the p-pillar layer 63 is narrower than the width of the p-pillar layer 42.

In the MOSFET 111, the pitch of the SJ structure of an area with low concentration between the main cell portion 4 and the sense portion 5 is narrower than the pitch of the SJ structure of the main cell portion 4 and the pitch of the SJ structure of the sense portion 5. Therefore, in the MOSFET 111, the breakdown voltage can be raised between the main cell portion 4 and the sense portion 5. For example, the occurrence of an avalanche breakdown at the periphery of the sense portion 5 can be further suppressed.

Second Embodiment

Next, the second embodiment will be explained.

FIG. 4A, FIG. 4B, FIG. 5A, and FIG. 5E are schematic diagrams showing the constitution of the power semiconductor device of the second embodiment.

Figure 4A:
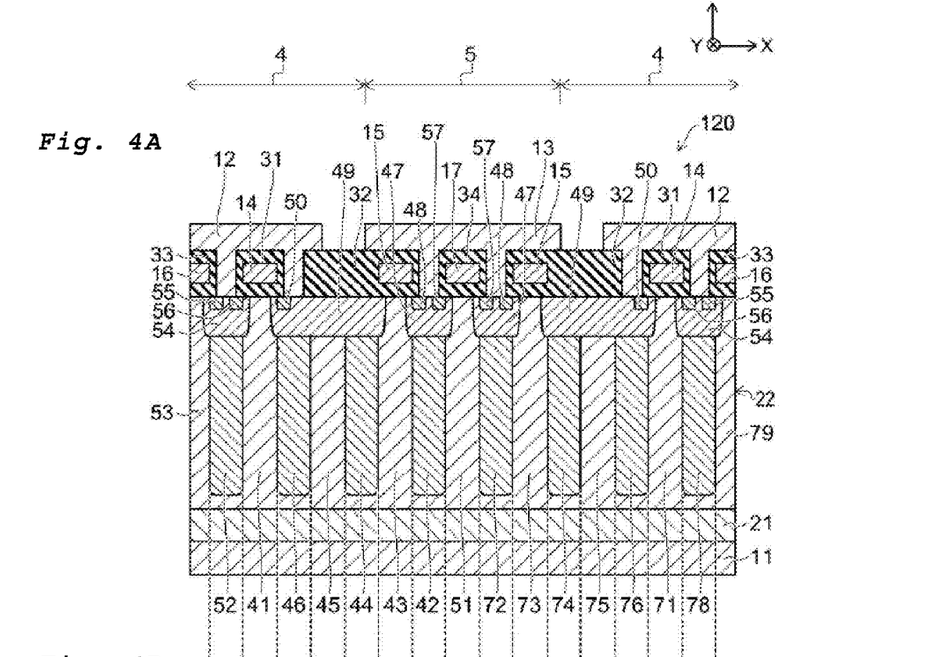
FIG. 4A and FIG. 4B are schematic sectional views of a power semiconductor device of a second embodiment, and of the dopant profile thereof.
Figure 4B:
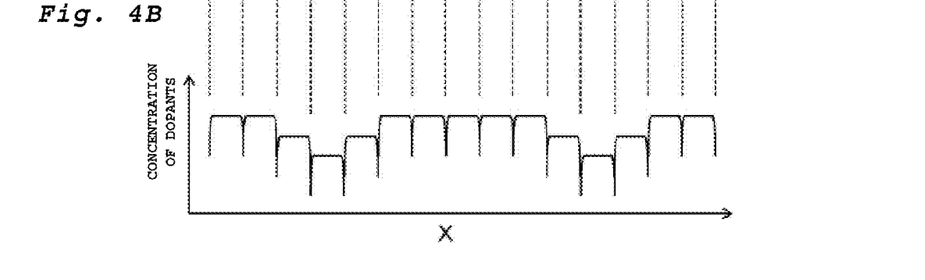
Figure 5A:
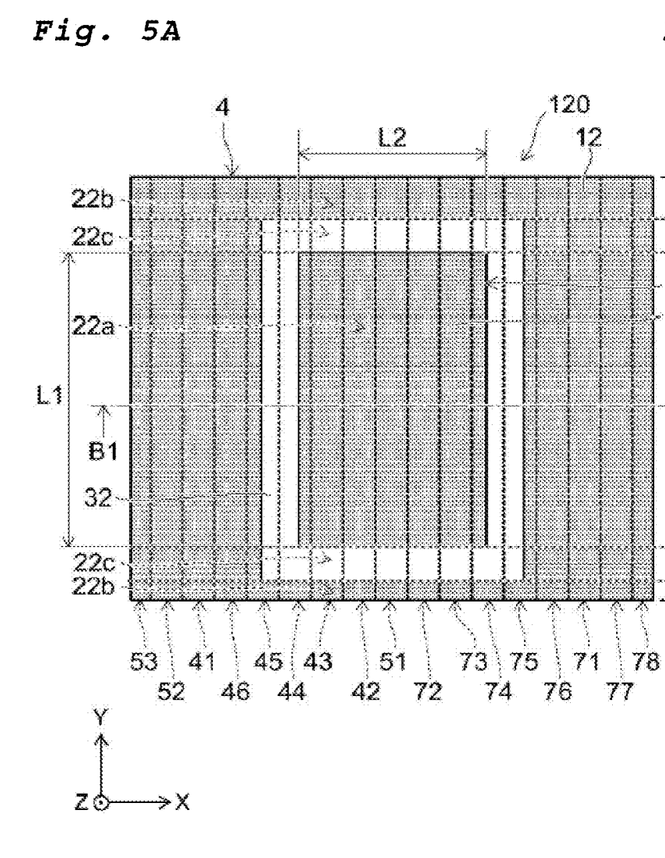
FIG. 5A and FIG. 5B are schematic plan view of showing the power semiconductor device of the second embodiment, and of the dopant profile thereof.
Figure 5B:
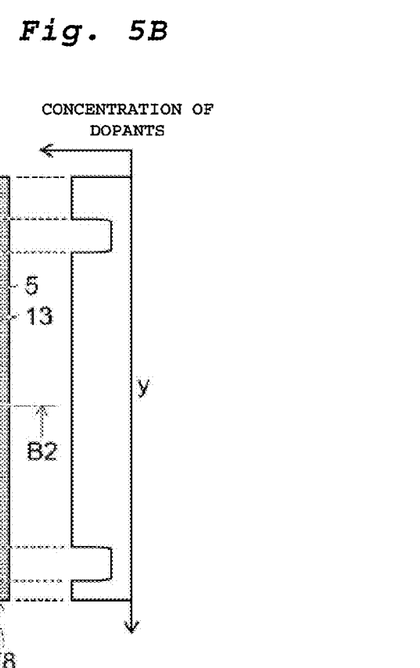

FIG. 4A is a schematic cross-sectional view illustrating the constitution of an MOSFET 120 of this embodiment and shows a cross section along B1-B2 line of FIG. 5A, FIG. 4B is a graph showing a concentration profile of dopant in the MOSFET 120, FIG. 5A is a schematic plan view showing the constitution of the MOSFET 120 of this embodiment. FIG. 5B is a graph showing the concentration profile of dopant in the MOSFET 120.

In the MOSFET 120, each of several n-pillar layers and several p-pillar layers extend along the Y-axis direction. In other words, the shape of the SJ structure of the MOSFET 120 is different from the shape of the SJ structure of the MOSFET 110. Since the constitution other than the SJ structure of the MOSFET 120 is substantially the same as the constitution of the MOSFET 110, its detailed explanation is omitted.

As shown in FIG. 4A, the drift layer 22 further includes an n-pillar layer 71, a p-pillar layer 72, an n-pillar layer 73, a p-pillar layer 74, an n-pillar layer 75, a p-pillar layer 76, a p-pillar layer 78, and an n-pillar layer 79.

The n-pillar layer 71, the n-pillar layer 73, the n-pillar layer 75, and the n-pillar layer 79 are respectively n type and extend in the Z-axis direction. The p-pillar layer 72, the p-pillar layer 74, the p-pillar layer 76, and the p-pillar layer 78 are respectively p type and extend in the Z—axis direction.

The n-pillar layer 71 is separated from the n-pillar layer 41 in the X-axis direction. The p-pillar layer 42 is formed between the n-pillar layer 41 and the n-pillar layer 71 in the X-axis direction.

The p-pillar layer 72 is formed between the p-pillar layer 42 and the n-pillar layer 71 in the X-axis direction. In this example, the p-pillar layer 72 is formed between the n-pillar layer 51 and the n-pillar layer 71 in the X-axis direction.

The n-pillar layer 73 is formed between the n-pillar layer 71 and the p-pillar layer 72 in the X-axis direction. The p-pillar layer 74 is formed between the n-pillar layer 71 and the n-pillar layer 73 in the X-axis direction. The n-pillar layer 75 is formed between the n-pillar layer 71 and the p-pillar layer 74 in the X-axis direction. The p-pillar layer 76 is formed between the n-pillar layer 71 and the n-pillar layer 75 in the X-axis direction.

The p-pillar layer 78 is separated from the p-pillar layer 76 in the X-axis direction. The n-pillar layer 71 is formed between the p-pillar layer 76 and the p-pillar layer 78 in the X-axis direction. The n-pillar layer 79 is separated from the n-pillar layer 71 in the X-axis direction. The p-pillar layer 78 is formed between the n-pillar layer 71 and the n-pillar layer 79 in the X-axis direction.

As shown in FIG. 4B, the concentration of dopant in the n-pillar layers 45 and 75 is lower than the concentration of dopant in the n-pillar layer 41, the concentration of dopant in the n-pillar layer 43, the concentration of dopant in the n-pillar layer 51, the concentration of dopant in the n-pillar layer 53, the concentration of dopant in the n-pillar layer 71, the concentration of dopant in the n-pillar layer 73, and the concentration of dopant in the n-pillar layer 79.

The dopant concentration in the p-pillar layers 74 and 76 and the dopant concentration in the p-pillar layers 45, 46 is lower than the dopant concentration in the p-pillar layer 42, the dopant concentration in the p-pillar layer 52, the dopant concentration in the p-pillar layer 72, and the dopant concentration in the p-pillar layer 78.

As shown in FIG. 5A, the n-pillar layer 41, p-pillar layer 42, n-pillar layer 43, the p-pillar layer 44, the n-pillar layer 45, the p-pillar layer 46, the n-pillar layer 51, the p-pillar layer 52, the n-pillar layer 53, the n-pillar layer 71, the p-pillar layer 72, the n-pillar layer 73, the p-pillar layer 74, the n-pillar layer 75, the p-pillar layer 76, the p-pillar layer 78, and the n-pillar layer 79, respectively, extend in the Y-axis direction. In other words, in the MOSFET 120, several n-pillar layers and several p-pillar layers are arranged in a stripe shape in an alternate fashion in the X-axis direction.

In the MOSFET 120, the sense electrode 13 has rectangular shape, and is surrounded by the source electrode 12. The length L1 along Y-axis direction of the sense electrode 13 is longer than the length L2 along X-axis direction of the sense electrode 13.

Across the width of the Y axis direction, the drift layer 22, within which the pillar layers are formed, includes a first portion 22a extending between the drain electrode 11 and the sense electrode 13 in the Z-axis direction, two second portions 22b between the drain electrode 11 and the source electrode 12 in the Z-axis direction, and two third portions 22c located intermediate of the first portion 22a and the second portion 22b in the Y-axis direction. In this example, the first portion 22a, second portions 22b, and third portions 22c respectively extend in the X-axis direction across the device.

The abscissa of FIG. 5B is the dopant concentration, and the ordinate is the position y in the Y-axis direction of the drift layer 22. Thus, FIG. 5B shows the dopant concentration of the drift layer 22 across the Y axis direction of the device.

As shown in FIG. 5B, in the drift layer 22, the dopant concentration of the n-pillar layer 41, p-pillar layer 42, n-pillar layer 43, the p-pillar layer 44, the n-pillar layer 45, and the p-pillar layer 46 in the third portions 22c thereof is lower than the dopant concentration of the n-pillar layer 41, p-pillar layer 42, n-pillar layer 43, the p-pillar layer 44, the n-pillar layer 45, and the p-pillar layer 46 in the first portion 22a and than p-pillar layer 46 in the second portions 22b. In the drift layer 22, the dopant concentration of the n-pillar layer 71, the p-pillar layer 72, the n-pillar layer 73, the p-pillar layer 74, the n-pillar layer 75, and the p-pillar layer 76 in the third portions 22c is lower than the dopant concentration of the n-pillar layer 71, the p-pillar layer 72, the n-pillar layer 73, the p-pillar layer 74, the n-pillar layer 75, and the p-pillar layer 76 in the first portion 22a, and in the second portions 22b. In addition, in the drift, layer 22, the dopant concentration of the n-pillar layer 51 in the third portions 22c is lower than the dopant concentration of the n-pillar layer 51 in the first portion 22a, and in the second portions 22b. The dopant concentration in the Y direction has the profile of FIG. 5B in each pillar layer, that is, for both a n-pillar layer 45, 75 already a having the lowest dopant concentration as among all the pillars, the dopant concentration in these pillars is even lower where the pillars cross regions 22C.

Thus, in the MOSFET 120, in the drift layer 22 constituting part of the sense portion 5, the concentration of dopant in a portion in the Y-axis direction between the main cell portion 4 and the sense portion 5 is lower than the concentration of dopant in a portion of the main cell portion 4 and the concentration of dopant in a portion of the sense portion 5.

Next, the effects that are exerted by the MOSFET 120 will be explained.

In the MOSFET 120, several n-pillar layers and several p-pillar layers of the drift layer 22 respectively extend along the Y-axis direction and are arranged in a stripe shape. In the drift layer 22, a current flows mainly in the n-pillar layers. For this reason, in the MOSFET 120, the propagation of a current in the X-axis direction between the main cell portion 4 and the sense portion 5 can be more appropriately suppressed. In the MOSFET 120, a power semiconductor device with a stable sense ratio can also be provided.

In the MOSFET 120, the concentration of dopant of the third portions 22c of the drift layer 22 is low. In other words, a low-concentration area as a high resistance is formed in the portion between the main cell portion 4 and the sense portion 5 in the Y-axis direction. Therefore, the propagation of a current in the Y-axis direction can also be appropriately suppressed.

In the MOSFET 120, the length L1 is longer than the length L2. In other words, the Y direction of the main cell portion 4 and the sense portion 5, in which a current propagates easily, is shorter than the span of the main cell portion 4 and the sense portion 5 in the Y-axis direction in which the propagation of a current is difficult. Therefore, compared with the case where the long L1 is shorter than the length L2, the propagation of the current can be more appropriately suppressed. The temperature dependency of the sense ratio can also be more appropriately suppressed.

Third Embodiment

Next, the third embodiment will be explained.

Figure 6:
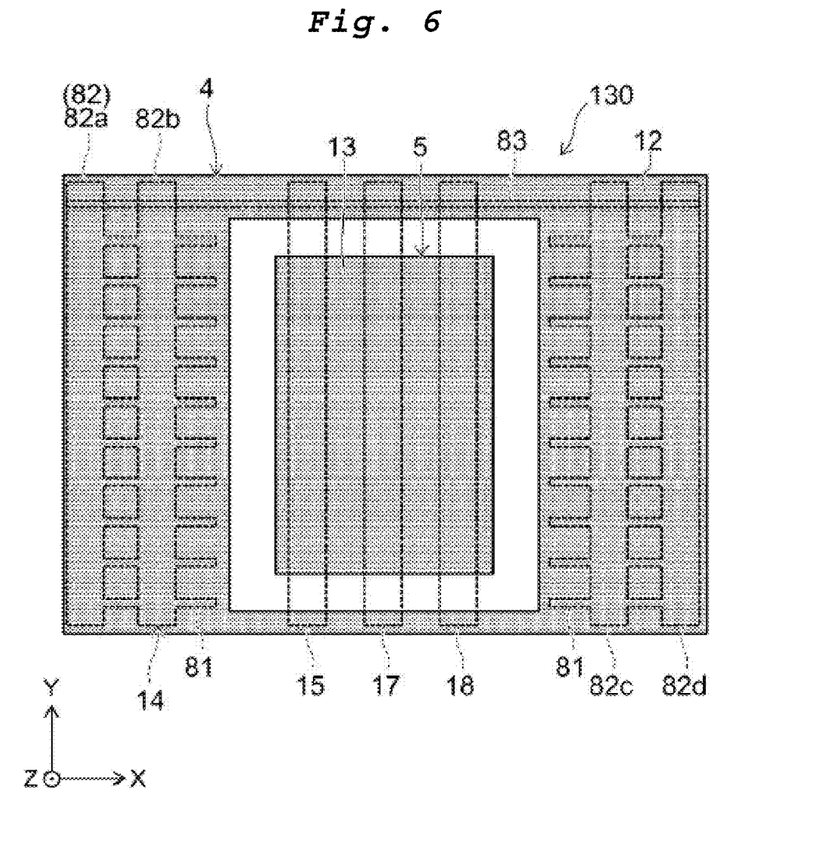
FIG. 6 is a schematic plan view showing the top view of the power semiconductor device of a third embodiment.

FIG. 6 is a schematic plan view showing the constitution of the power semiconductor device of the third embodiment.

As shown in FIG. 6, in an MOSFET 130, the gate electrode 14 has a mesh shape including several first extending parts 81 extending in the X-axis direction and several second extending parts 82 extending in the Y-axis direction. In this example, four second extending parts 82a-82d, in the shape of generally rectangular electrodes are formed and extend in the Y direction substantially over the span of the cell. The second linear part 82a, for example, is formed over the n-pillar layer 53. The second linear part 82b, for example, is formed over the n-pillar layer 41. The second linear part 82c, for example, is formed over the n-pillar layer 71. The second linear part 82d, for example, is formed over the n-pillar layer 79.

In the MOSFET 130, the gate electrode 15 for sense and the gate electrode 17 for rectangular strip shape and extend in the Y-axis direction substantially across the cell in the Y direction. In addition, in the MOSFET 130, the gate electrode 18 for sense is formed. The gate electrode 18 for sense has a rectangular strip shape extending in the Y-axis direction substantially across the cell in the Y direction and for example, is formed on the n-pillar layer 73. As a result, in the MOSFET 130, a stripe-shaped pattern is formed in the sense portion 5 by the gate electrode 15 for sense, gate electrode 17 for sense, and gate electrode 18 for sense. The gate electrode 15 for sense, gate electrode 17 for sense, and gate electrode 18 for sense are electrically connected to the gate electrode 14 by a wiring 83 extending in the X direction adjacent one end of the cell.

Next, the effects that are exerted by the MOSFET 130 will be explained.

In case a current is detected by the sense circuit 13, the voltage between the sense electrode 13 for sense and the gate electrode 15 for sense is lowered as much as the voltage drop in the sense resistance. In other words, a gate voltage, which is applied to the gate electrode 15 for sense is lower than a gate voltage which is applied to the gate electrode 14. The difference between the gate electrode of the gate electrode 14 and the gate electrode of the gate electrode 15 for sense results is a result of difference of the channel resistance. In a static state in which voltage is applied to the gate electrode, the ratio of the channel resistance to the resistance of the entire path in which a current flows is small. For this reason, in the static state in which the gate voltage is applied, the differences in the gate voltage has no considerable influence on the sense ratio.

However, in a dynamic state such as switching, the gate current depends upon the gate voltage. For this reason, for example, the charge and discharge time of a gate capacitance is changed by the differences in the gate voltage. In other words, an execution or timing difference is generated between the operation time of the memory cell part 4 and the operation time of the sense portion 5.

In the MOSFET 130 of this embodiment, the total area of the gate electrode per unit cell of the memory cell part 4 is larger than the total gate electrode area per unit cell of the sense portion 5. The area of the gate electrode 14 is larger than the total area of the area of the gate electrode 15 for sense, the area of the gate electrode 17 for sense, and the area of the gate electrode 18 for sense. In other words, in the MOSFET 130, the gate capacitance of the memory cell part 4 is larger than the gate capacitance of the sense portion 5. Therefore, the difference of the gate voltage can be compensated for. In the MOSFET 130, the stability of the sense ratio in a dynamic state such as switching can also be improved.

Next, a modified example of the third embodiment will be explained.

Figure 7:
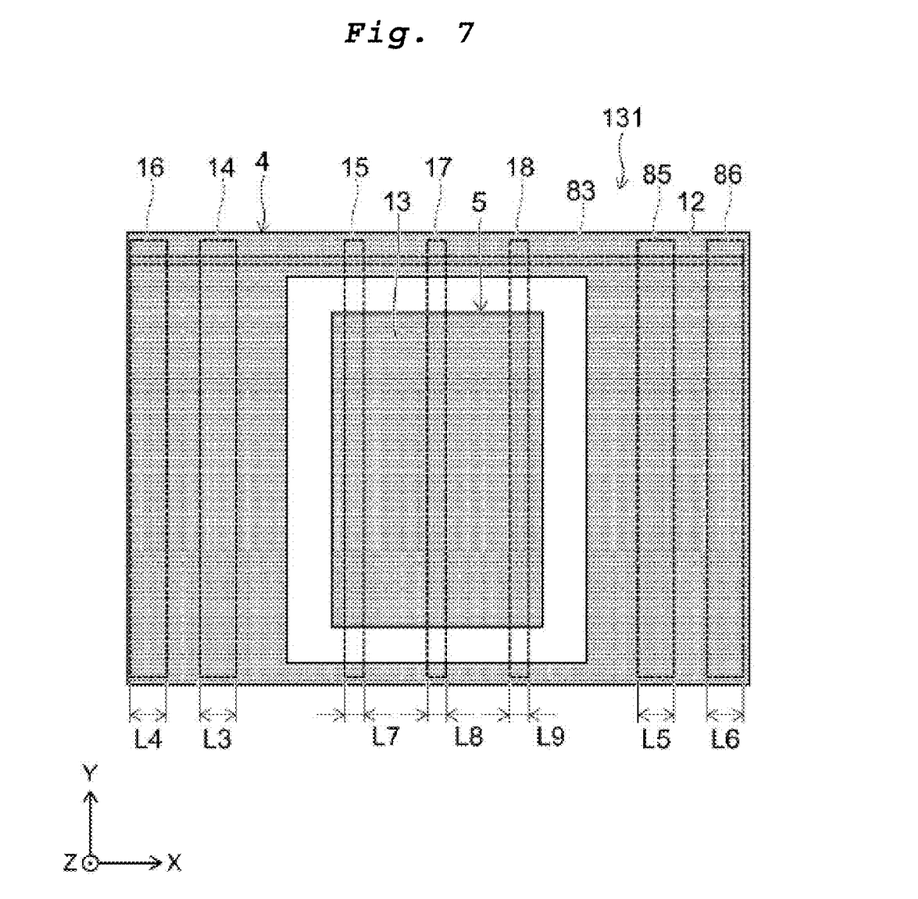
FIG. 7 is a schematic diagram showing the top view of the power semiconductor device of a modified example of the third embodiment.

FIG. 7 is a schematic diagram showing the constitution of the power semiconductor device of the modified example of the third embodiment.

As shown in FIG. 7, in an MOSFET 131, the gate electrode 14 and the gate electrode 16 have a strip shape extending in the Y-axis direction. In the MOSFET 131, a gate electrode 85 and a gate electrode 86 are formed. The gate electrode 85 has a strip shape extending in the Y-axis direction and for example, is formed on the n-pillar layer 71. The gate electrode 86 has a strip shape extending in the Y-axis direction and for example, is formed on the n-pillar layer 79.

The length L3 along the X-axis direction of the gate electrode 14, the length L4 along the X-axis direction of the gate electrode 16, the length L5 along the X-axis direction of the gate electrode 85, and the length L6 along the X-axis direction of the gate electrode 86 are longer than the length L7 along the X-axis direction of the gate electrodes 15, 17 and 18 for sense, Therefore, the gate electrode area per unit cell of the memory cell part 4 is larger than the gate electrode area per unit cell of the sense portion 5.

Therefore, the area may be adjusted by the width of the linear gate electrodes. In the MOSFET 131, similarly to the MOSFET 130, the stability of the sense ratio in a dynamic state such as switching can also be improved.

For example, the area may be adjusted by setting the pattern of the gate electrode of the main cell portion 4 to an offset mesh pattern, and setting the pattern of the gate electrode of the sense portion 5 to a stripe pattern. The area may also be adjusted by setting the pattern of the gate electrode of the main cell portion 4 to a mesh pattern, and setting the pattern of the gate electrode of the sense portion 5 to an offset mesh pattern.

In the respective embodiments, the MOSFET with a planar-type gate structure is shown as the power semiconductor device. The power semiconductor device, for example, may also be an MOSFET with a trench gate-type structure. In addition, the power semiconductor device, for example, may also be IGBT, etc. In case the power semiconductor device is IGBT, for example, the first electrode is a collector electrode, the second electrode is an emitter electrode, the first semiconductor layer is a second conductivity-type p-collector layer, and the fifth semiconductor layer is an n-emitter layer. Moreover, the stripe-shaped SJ structure in which several n-pillar layers NP and several p-pillar layers PP are arranged in an alternate fashion is shown in the respective embodiments. The SJ structure, for example, may be a mesh-shaped structure in which several n-pillar layers NP are intersected or may also be a structure in which several n-pillar layers NP and several p-pillar layers PP are arranged in a check pattern shape (zigzag shape).

According to the embodiments, power semiconductor devices with a stable sense ratio can be provided.

Here, in this specification, "vertical" and "parallel," for example, include scattering in the manufacturing processes as well as strictly vertical and strictly parallel and may be substantially vertical and substantially parallel.

In the above, the embodiments of the present disclosure have been explained with reference to the detailed examples. However, the embodiments of the present disclosure are not limited to these detailed examples. For example, the detailed constitutions of each element such as the first electrode, first semiconductor layer, second semiconductor layer, second electrode, third electrode, fourth electrode, fifth electrode, first pillar layer, second pillar layer, third semiconductor layer, fourth semiconductor layer, fifth semiconductor layer, and sixth semiconductor layer are appropriately selected from well-known ranges by the person skilled in the art and are included in the range of the present embodiment as long as the present embodiment is similarly applied and similar effects can be obtained.

In addition, the combinations of two or more of elements of each detailed example in a technically possible range are also included in the range of the present embodiment as long as the essence of the present embodiment is included.

Moreover, based on the power semiconductor devices mentioned above as the embodiments of the present disclosure, all the power semiconductor devices, whose design can be appropriately changed by the person skilled in the art, also belong to the range of the present embodiment as long as the essence of the present embodiment is included.

Furthermore, in the category of the concept of the present embodiment, any person skilled in the art can obtain various kinds of modified examples and varied examples, and it can be understood that these modified examples and varied examples also belong to the range of the present embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A power semiconductor device, comprising:
a sense region;
a device region surrounding the sense region;
a plurality of interdigited n-doped layers and p doped layers, the plurality arrayed across the sense region and the device region in a first direction, wherein
the dopant concentration of the n-doped layers and p-doped layers at a boundary between the device region and the sense region is different from the dopant concentration of the n doped layers and p doped layers away from the boundary.

2. The power semiconductor of claim 1, further including:
a source electrode electrically coupled to a p doped layer in the sense region and a p doped layer in the device region;
a sense electrode electrically coupled to a n doped layer in the sense region; and
a drain electrode electrically connected to the n doped layers.

3. The power semiconductor layer of claim 2, wherein the dopant concentration of the p doped layers at the boundary between the device region and the sense region is lower than the dopant concentration of the p doped layers in the sense region away from the boundary between the device region and the sense region.

4. The power semiconductor layer of claim 2, wherein the dopant concentration of the n doped layer at the boundary between the device region and the sense region is lower than the dopant concentration of the n doped layers in the sense region away from the boundary between the device region and the sense region.

5. The power semiconductor layer of claim 2, wherein the dopant concentration of only one n doped layer in the device region is lower than the dopant concentration of the p doped layer in the sense region.

6. The power semiconductor device of claim 1, wherein at least some of the n and the p layers extend across the sense region and the device region in a second direction perpendicular to the first direction; and
the dopant concentration of the at least some of the n and p layers varies along the second direction.

7. The power semiconductor of claim 6, wherein the dopant concentration in the at least some of the n layers and p layers is lower in a portion between the sense region and the device region in the second direction than in portions within the sense and device regions.

8. The power semiconductor of claim of claim 1, wherein the area of the source electrode is greater than the area of the sense electrode.

9. A power semiconductor device, comprising:
a first electrode,
a first semiconductor layer that is formed on the first electrode and electrically connected to the first electrode,
a second semiconductor layer formed on the first semiconductor layer,
several first pillar layers of the first conductivity type that are formed on the second semiconductor layer and arranged in the first direction perpendicular to the stacking direction of the first semiconductor layer and the second semiconductor layer,
a third semiconductor layer of the second conductivity type formed on the second semiconductor layer,
a fourth semiconductor layer of the second conductivity type formed at a position different from the third semiconductor layer on the second semiconductor layer,
a fifth semiconductor layer of the first conductivity type that is formed on the third semiconductor layer and is adjacent to the first pillar layers via the third semiconductor layer in the first direction, a sixth semiconductor layer of the first conductivity type that is formed on the fourth semiconductor layer and is adjacent to the first pillar layers via the fourth semiconductor layer in the first direction, a second electrode electrically connected to the third semiconductor layer and the fifth semiconductor layer, a third electrode that is formed on the second semiconductor layer, separated from the second electrode in the first direction, and electrically connected to the fourth semiconductor layer and the sixth semiconductor layer, a fourth electrode formed via an insulating film on the third semiconductor layer, on the fifth semiconductor layer, and on the first pillar layers adjacent to the third semiconductor layer, and a fifth electrode formed via an insulating film on the fourth semiconductor layer, on the sixth semiconductor layer, and on the first pillar layers adjacent to the fourth semiconductor layer;

wherein a concentration of dopant of the first pillar layer positioned between the first pillar layer positioned under the fourth electrode and the first pillar layer positioned under the fifth electrode is lower than a concentration of dopant of the first pillar layer positioned under the fourth electrode and the concentration of dopant of the first pillar layer positioned under the fifth electrode.

10. The power semiconductor device according to claim 9, further comprising:

several second pillar layers of the second conductivity type are formed between each of several first pillar layers, wherein a concentration of dopant of the second pillar layer positioned between the first pillar layer positioned under the fourth electrode and the first pillar layer positioned under the fifth electrode is lower than a concentration of dopant of the second pillar layer positioned other than between the first pillar layer positioned under the fourth electrode and the first pillar layer positioned under the fifth electrode.

11. The power semiconductor device according to claim 9, wherein a center of the width in the first direction of the third semiconductor layer is provided between the fifth semiconductor layer and the sixth semiconductor layer.

12. The power semiconductor device according to claim 9, wherein several first pillar layers extend in a second direction perpendicular to the stacking direction and the first direction.

13. The power semiconductor device according to claim 12, wherein a length along the second direction of the third electrode is longer than a length along the first direction of the third electrode.

14. The power semiconductor device according to claim 12, wherein the second semiconductor layer includes a first portion between the first electrode and the third electrode portion, a second portion between the first electrode and the second electrode, and a third portion between the first portion and the second portion, and a concentration of dopant of several first pillar layers in the third portion is lower than a concentration of dopant of several first pillar layers in the first portion and the concentration of dopant of several first pillar layers in the second portion.

15. The power semiconductor device according to claim 9, wherein an area of the fourth electrode is larger than an area of the fifth electrode; and the fourth electrode has a mesh shape, and the fifth electrode has a linear shape.

* * * * *